(12) United States Patent
Mizushima et al.

(10) Patent No.: US 12,019,921 B2
(45) Date of Patent: *Jun. 25, 2024

(54) APPARATUS FOR PROCESSING RECEIVED DATA

(71) Applicant: Hitachi, Ltd., Tokyo (JP)

(72) Inventors: Nagamasa Mizushima, Tokyo (JP); Kentaro Shimada, Tokyo (JP)

(73) Assignee: HITACHI, LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/129,191

(22) Filed: Mar. 31, 2023

(65) Prior Publication Data
US 2023/0236766 A1   Jul. 27, 2023

Related U.S. Application Data

(63) Continuation of application No. 17/462,549, filed on Aug. 31, 2021, now Pat. No. 11,640,265, which is a (Continued)

(30) Foreign Application Priority Data

Dec. 16, 2020 (JP) ................................. 2020-208090

(51) Int. Cl.
*H03M 7/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .... G06F 3/0659; G06F 3/0604; G06F 3/0679; G06F 7/523; H03M 7/3084; H03M 7/6005; H03M 7/6023
See application file for complete search history.

(56) References Cited

U.S. PATENT DOCUMENTS 5,126,739 A   6/1992  Whiting
5,146,221 A   9/1992  Whiting
(Continued)

FOREIGN PATENT DOCUMENTS

JP   6-175792 A   6/1994
JP   8-195680 A   7/1996
(Continued)

OTHER PUBLICATIONS

Ivan Shcherbakov et al., "A Parallel Adaptive Range Coding Compressor: Algorithm, FPGA Prototype, Evaluation", Data Compression Conference, 2012, pp. 119-128.
(Continued)

*Primary Examiner* — Jean B Jeanglaude
(74) *Attorney, Agent, or Firm* — MATTINGLY & MALUR, PC

(57) ABSTRACT

To speed up decoding of a range code. A decompression circuit calculates a plurality of candidate bit values for each bit of the N-bit string based on a plurality of possible bit histories of a bit before a K-th bit in parallel for a plurality of bits, and repeatedly selects a correct bit value of the K-th bit from the plurality of candidate bit values based on a correct bit history of the bit before the K-th bit to decode the N-bit string.

14 Claims, 11 Drawing Sheets

Related U.S. Application Data continuation of application No. 17/189,396, filed on Mar. 2, 2021, now Pat. No. 11,119,702.

(51) Int. Cl.
  *G06F 7/523* (2006.01)
  *H03M 7/30* (2006.01)

(52) U.S. Cl.
  CPC .......... *G06F 7/523* (2013.01); *H03M 7/3084* (2013.01); *H03M 7/6005* (2013.01)

(56) References Cited

U.S. PATENT DOCUMENTS

| | | |
|---|---|---|
| 5,463,390 A | 10/1995 | Whiting |
| 5,506,580 A | 4/1996 | Whiting |
| 5,546,533 A | 8/1996 | Koyama |
| 5,652,857 A | 7/1997 | Shimoi et al. |
| 5,867,114 A | 2/1999 | Barbir |
| 5,956,733 A | 9/1999 | Nakano et al. |
| 6,253,264 B1 | 6/2001 | Sebastian |
| 7,667,630 B2 | 2/2010 | Harada |
| 8,525,708 B2 | 9/2013 | Kushida |
| 8,799,559 B2* | 8/2014 | Sharon ................ G06F 12/0246 711/170 |
| 2003/0072446 A1* | 4/2003 | Jaquette ............. G06F 21/6209 380/46 |
| 2013/0103891 A1* | 4/2013 | Sharon ................ G06F 12/0246 711/E12.001 |
| 2013/0154857 A1 | 6/2013 | Kushida |
| 2014/0269317 A1 | 9/2014 | Wang |

FOREIGN PATENT DOCUMENTS

| | | |
|---|---|---|
| JP | 8-249159 A | 9/1996 |
| JP | 10-161913 A | 6/1998 |
| JP | 2013-126160 A | 6/2013 |

OTHER PUBLICATIONS

Japanese Office Action received in corresponding Japanese Application No. 2020-208090 dated Nov. 8, 2022.

\* cited by examiner

APPARATUS FOR PROCESSING RECEIVED DATA

CLAIM OF PRIORITY

The present application claims priority from Japanese patent application JP 2020-208090 filed on Dec. 16, 2020, the content of which is hereby incorporated by reference into this application.

BACKGROUND OF THE INVENTION

1. Field of the Invention

The present invention relates to a technique for decoding an input code compressed based on a range code.

2. Description of the Related Art

For a storage system, which is an information device for accumulating and managing a large amount of data, cost per capacity can be reduced by storing a larger amount of data. Therefore, some storage systems have a function of compressing written data and storing the compressed data in a disk drive.

For example, recently, as a storage medium of a storage system, a solid state drive (SSD) equipped with a NAND flash memory, which is a nonvolatile semiconductor memory, has been adopted in addition to or instead of a hard disk drive (HDD). Since the SSD does not have a physical head seek mechanism such as an HDD in data access, the SSD has a small head delay (latency) and has excellent response performance in random data read.

For this reason, in an application such as a database in which high-speed random read is required, replacement from an HDD to an SSD has progressed as a storage medium of a storage system. It is noted that bit cost of the SSD has been reduced year by year with a high integration of flash memory cells, but still remains as high as about 3 times bit cost of the HDD.

In many cases, a storage system using an SSD as a storage medium has a function of reducing a size of data to be stored in the SSD by introducing a lossless compression technique. As a result, storage capacity of the system can be made to appear virtually large, and the cost per capacity can be reduced so as to approach that of a storage system using an HDD as a storage medium.

When the storage system receives a read request for compressed data from a host, the compressed data is decompressed, restored to an original plaintext data, and then replied to the host. It is preferable that decompression processing of the compressed data is performed as fast as possible so that a read response time at that time is not significantly deteriorated as compared with a case of reading uncompressed data.

The higher the compression ratio of a compression algorithm employed for a data compression function of the storage system, the lower the cost per capacity. An LZMA algorithm is a lossless data compression algorithm known to have a high compression ratio. In this algorithm, slide dictionary compression is combined with an arithmetic code called a range code.

In a processing based on the range code, it is necessary to perform multiplication each time one bit is input (at the time of coding) or output (at the time of decoding). Therefore, a bit rate of the processing based on the range code is very slow. Although a table is referenced for a value used for multiplication in the processing based on the range code, an index for reference is determined by a bit history of the input (at the time of coding) or the output (at the time of decoding). When the multiplication in the processing based on the range code can be performed in parallel for a plurality of bits, performance thereof is improved, and processing performance of the LZMA algorithm is improved.

As for coding processing based on the range code (at the time of compression), there has been known a technique in which a bit history is prepared in advance, a table reference is parallelized, and multiplication is performed on a plurality of bits in parallel to increase a speed, as in "A Parallel Adaptive Range Coding Compressor: Algorithm, FPGA Prototype, Evaluation", Ivan Shcherbakov and Norbert Wehn, Data Compression Conference, 2012 (Non-PTL 1). When a degree of parallelism is N, coding performance is improved by N times. As a result, compression processing of LZMA can be speeded up.

In decoding of a range code (at the time of decompression), since a bit history is uncertain until an immediately preceding bit is decoded, it is difficult to perform multiplication using a table reference and a reference value of the table reference for a plurality of bits in parallel.

Therefore, for example, when a range code is applied to a compression and decompression function of a storage system, a read response time to a read request from a host increases, and convenience of the storage system may deteriorate since decompression performance is low.

SUMMARY OF THE INVENTION

According to an aspect of the invention, there is provided an apparatus for processing received data. The apparatus includes: a circuit configured to receive an input code compressed based on a range code; and a decompression circuit configured to decompress a part or all of the input code to decode an N-bit string, in which N represents an integer greater than 1, and K represents an integer from 1 to N, a bit value of a K-th bit of the input code is decoded based on a bit history of a bit before the K-th bit, and the decompression circuit is configured to calculate a plurality of candidate bit values for each bit of the N-bit string based on a plurality of possible bit histories of the bit before the K-th bit in parallel for a plurality of bits, and repeatedly select a correct bit value of the K-th bit from the plurality of candidate bit values based on a correct bit history of the bit before the K-th bit to decode the N-bit string.

According to an aspect of the invention, decoding of a range code can be speeded up.

According to an aspect of the invention, an apparatus processing received data includes a circuit configured to receive an input code compressed based on a range code; and a plurality of decompression circuits configured to decompress a part or all of the input code to decode a bit string, wherein a bit value of a bit of the input code is decoded based on a bit history of a bit before the bit, and wherein the plurality of decompression circuits are configured to: calculate a plurality of candidate bit values for each bit of the bit string based on a plurality of possible bit histories of the bit before the bit, and repeatedly select a correct bit value of the bit from the plurality of candidate bit values based on a correct bit history of the bit before the bit to decode the bit string.

DESCRIPTION OF THE PREFERRED EMBODIMENTS

In the following description, when necessary for convenience, an embodiment may be divided into a plurality of sections or embodiments in the description. However, unless otherwise specified, these are not unrelated to one another, but in a relationship where one is a modification, a detail, supplementary explanation, and the like of a part or all of another. In the following description, when a reference is made to the number of elements and the like (including a count, a numeric value, an amount, a range and the like), unless otherwise specified and limited theoretically apparently to a specific number and the like, the number is not limited to the specific number and may be either equal to or larger than or equal to or less than the specific number.

(1) System Configuration

Hereinafter, a storage system having a data compression function will be described as an embodiment of the present specification. The storage system reduces an amount of stored data by lossless compression. Decoding of a range code described in the present specification can be applied to a system different from the storage system, for example, a communication system.

Figure 1:
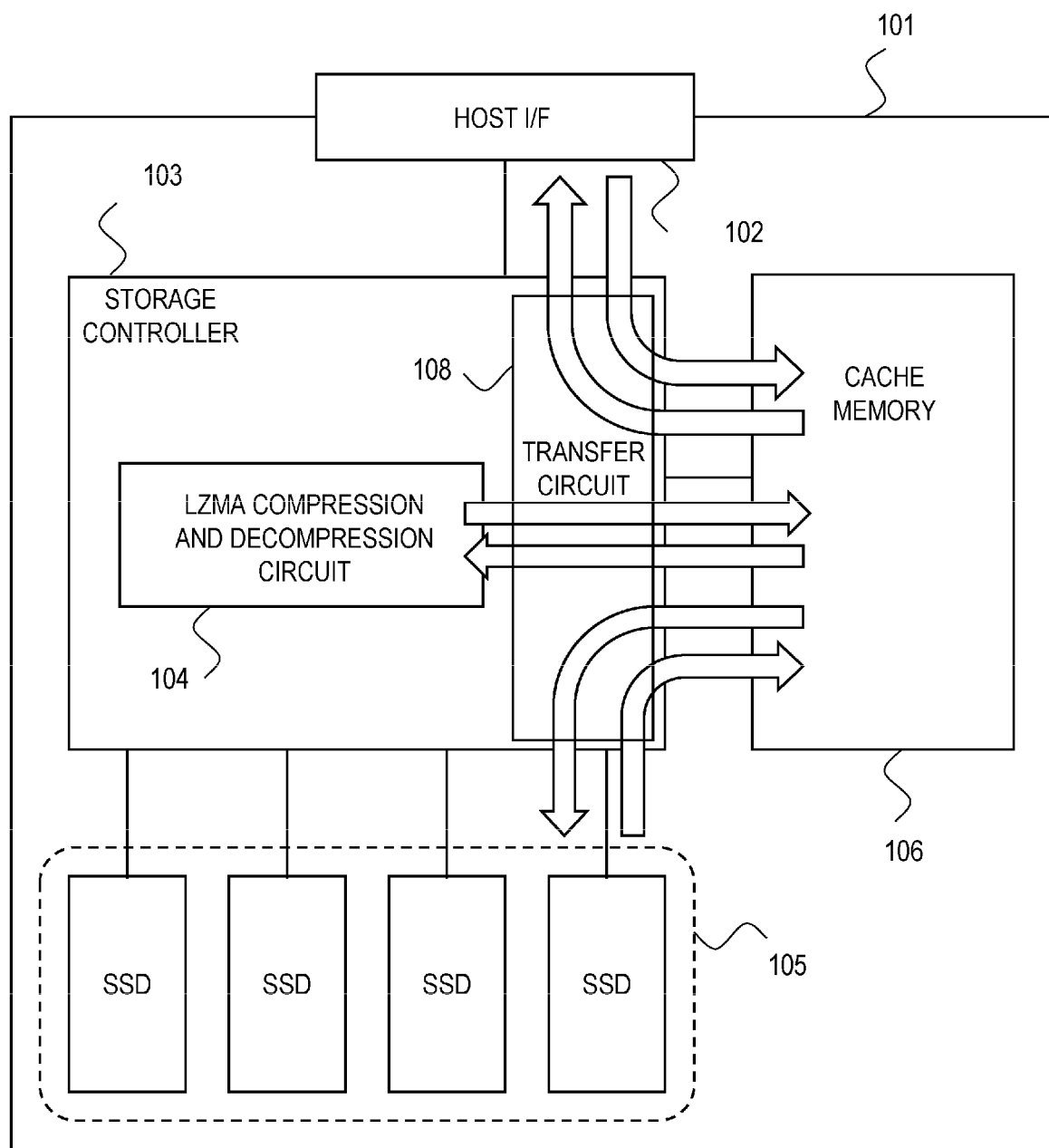
FIG. 1 shows a configuration example of a storage system.

FIG. 1 shows a configuration example of the storage system according to the embodiment of the present specification. A storage system 101 includes a host interface (I/F) 102, a storage controller 103, a plurality of solid state drives (SSD) 105, and a cache memory 106 using a volatile memory such as a dynamic random access memory (DRAM).

The storage controller 103 is connected to the host I/F 102, the SSD 105, and the cache memory 106, and includes a microprocessor that controls the host I/F 102, the SSD 105, and the cache memory 106. The microprocessor executes content interpretation of a read and write command from a host (not shown), data transmission and reception to and from the host, data compression and decompression by an LZMA compression and decompression circuit 104, and data transfer between the SSD 105 and the cache memory 106.

The host I/F 102 is an interface mechanism for connecting to an external host, and responds to the read and write command so as to transmit data to the host or receive data from the host. A mechanism of the host I/F 102 and a protocol for transmitting and receiving a command and data conform to, for example, a standard interface standard.

The storage controller 103 includes the LZMA compression and decompression circuit 104 and a transfer circuit 108. The transfer circuit 108 receives and transmits data compressed or decompressed by the LZMA compression and decompression circuit 104. The transfer circuit 108 transfers data between components of the storage system 101, for example, between the LZMA compression and decompression circuit 104 and the cache memory 106. The LZMA compression and decompression circuit 104 reversibly compresses received write data in accordance with a write command to reduce an amount of data to be stored in the SSD 105, which is a storage drive, and generates compressed data. In addition, in order to transmit original plaintext data to the host in accordance with the read command, the compressed data read from the SSD 105 is decompressed to generate plaintext data.

The write data from the host is first temporarily stored in the cache memory 106. At this time, the storage controller 103 replies write completion to the host. Thereafter, the write data is converted into compressed data through the LZMA compression and decompression circuit 104, and the compressed data is also temporarily stored in the cache memory 106. Then, the compressed data is written to the SSD 105.

On the other hand, the read data to the host is read from the SSD 105 in a compressed state, and is first temporarily stored in the cache memory 106. Thereafter, the read data is converted into plaintext data through the LZMA compression and decompression circuit 104, and the plaintext data is also temporarily stored in the cache memory 106. Then, the plaintext data is transmitted to the host.

As described above, in the data write, compression processing is executed after replying the write completion, so that write performance visible to the host is constant regardless of whether the data is compressed or not; but the data read is not completed until the data reply to the host is completed, and thus read response performance visible to the host depends on a decompression time of the compressed data. That is, the LZMA compression and decompression circuit 104 is required to perform decompression processing with high performance.

The LZMA compression and decompression circuit 104 is implemented as, for example, hardware (logic circuit) designed based on a data decompression method according to an embodiment of the present specification. Since the LZMA compression and decompression circuit 104 has high-speed data decompression performance, the storage system 101 can utilize high-speed random read performance, which is a feature of the SSD, not only for uncompressed data but also for compressed data. A function of the LZMA compression and decompression circuit 104 may be implemented by a plurality of processing devices that execute a program. The processing device includes a processor, a processor core, a central processing unit, and the like. A storage drive different from the SSD, for example, a hard disk drive (HDD) may be used.

(2) LZMA Algorithm

The LZMA algorithm will be described with reference to FIGS. 2A to 5B as premise knowledge for describing the data decompression method according to the embodiment of the present specification.

(2-1) Outline of LZMA Algorithm

Figure 2A:
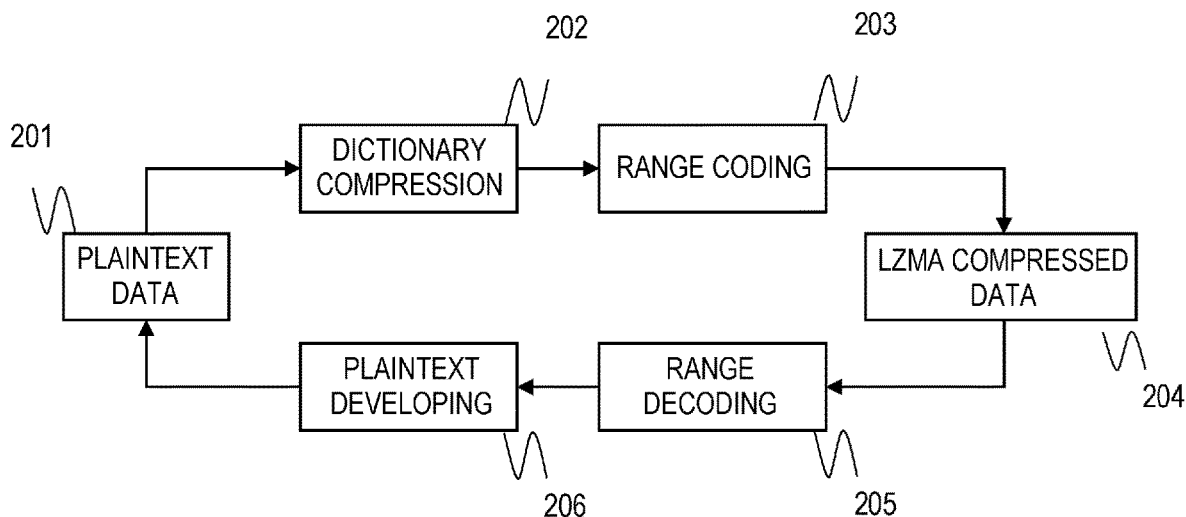
FIG. 2A shows an outline of an LZMA algorithm.

FIG. 2A shows an outline of the LZMA algorithm. In LZMA compression processing, plaintext data 201 before compression is first subjected to dictionary compression processing 202. After that, a dictionary compression result is subjected to a range coding processing 203. As a result, LZMA compressed data 204 is generated.

On the other hand, in the LZMA decompression processing, the compressed data 204 is first subjected to range decoding processing 205. After that, a decoding result is subjected to plaintext developing processing 206. Thus, the original plaintext data 201 is generated.

(2-2) Dictionary Compression Processing

Figure 2B:
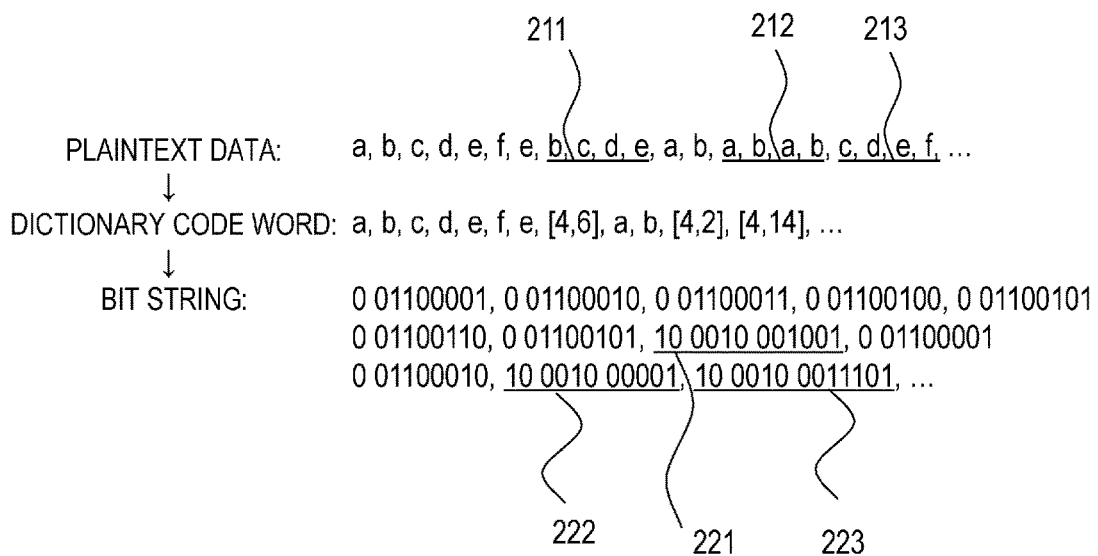
FIG. 2B shows a specific example of dictionary compression processing.

FIG. 2B shows a specific example of the dictionary compression processing 202 constituting the LZMA algorithm. Whether the same character string appears again in a character string stream of the plaintext data 201 is checked in order. When a certain character string coincides with L characters consecutively from a character ahead by J characters counted from a first character of the certain character string as a starting point, the character string is converted into a copy symbol [L, J].

For example, a character string 211 of four characters "b, c, d, e" coincides with 4 characters consecutively from a character ahead by 6 characters counted from a first character "b" of the character string 211 as a starting point. In this case, the character string 211 is converted into a copy symbol [4, 6]. Similarly, a character string 212 of four characters "a, b, a, b" coincides with 4 characters consecutively from a character ahead by 2 characters counted from a first character "a" of the character string 212 as a starting point (including parts overlapping each other). In this case, the character string 212 is converted into a copy symbol [4, 2].

Similarly, a character string 213 of four characters "c, d, e, f" coincides with 4 characters consecutively from a character ahead by 14 characters counted from a first character "c" of the character string 213 as a starting point. In this case, the character string 213 is converted into a copy symbol [4, 14]. Since an amount of data of these copy symbols is smaller than the amount of data of the original character string, the amount of data can be reduced by this conversion.

A range of a character string stream (hereinafter referred to as a dictionary) referred to in a coinciding search is set to a range from a character ahead by 1 character to a character ahead by a predetermined number of characters. The compression technique is also called slide dictionary compression because the dictionary range slides backwards with each search. When there are a plurality of coinciding character strings in the dictionary range, the longest consecutive coinciding character string is converted into a copy symbol. This has an effect of further reducing the amount of data.

In order to generate data to be input to the range coding processing 203 in a subsequent stage, it is necessary to code characters that are not converted into copy symbols (hereinafter, referred to as literal characters) and copy symbols with a prescribed bit pattern, and link the characters and the copy symbols to form a bit stream.

FIG. 2B shows a bit stream as a result of coding according to a rule of an LZMA specification. The bit stream is input to the range coding processing 203. For example, a bit pattern 221 represents the copy symbol [4, 6] with a length of 12 bits. A bit pattern 222 represents the copy symbol [4, 2] with a length of 11 bits. A bit pattern 223 represents the copy symbol [4, 14] with a length of 13 bits. As described above, a bit pattern length corresponding to the copy symbol is not fixed. On the other hand, a literal character is represented by a 9-bit length bit pattern in which 1 bit of 0 is added to the beginning of an 8-bit value of the character.

The range decoding processing 205 outputs such a bit stream in the LZMA decompression processing. In the plaintext developing processing 206, when such a bit stream is input, the bit stream is interpreted as a copy symbol or a literal character, and the character string stream of the plaintext data 201 is restored.

(2-3) Range Coding and Decoding Processing

Figure 3A:
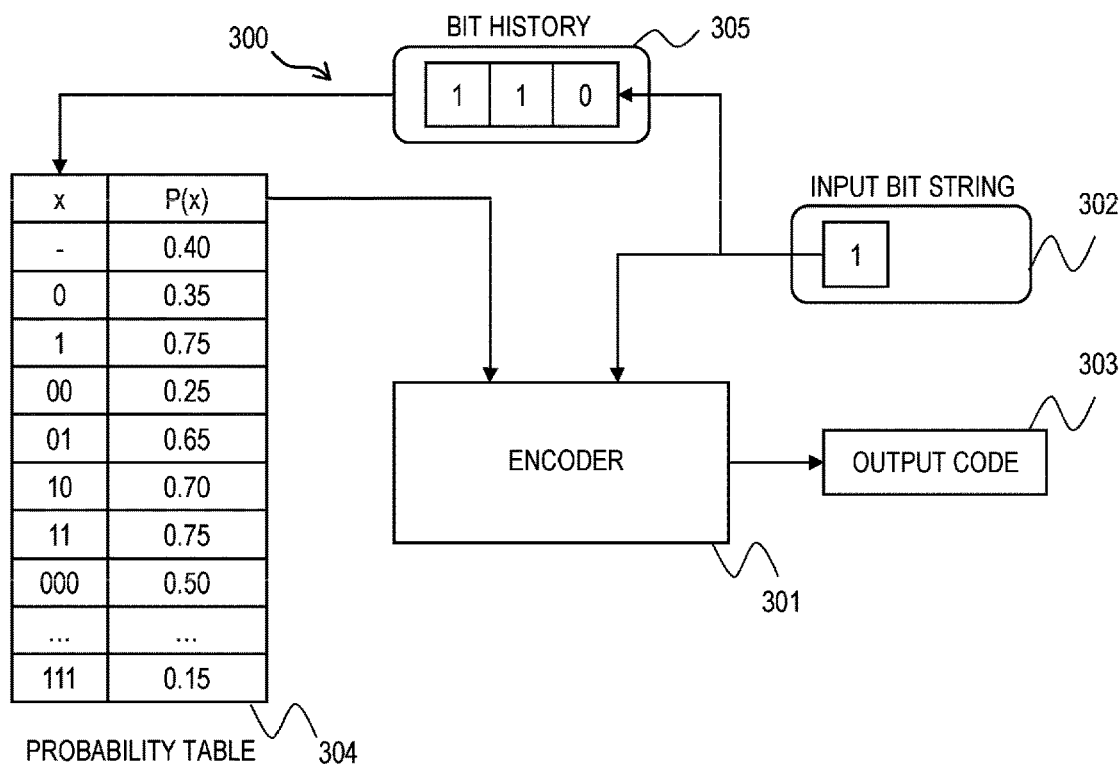
FIG. 3A shows a functional block diagram of range coding.
Figure 3B:
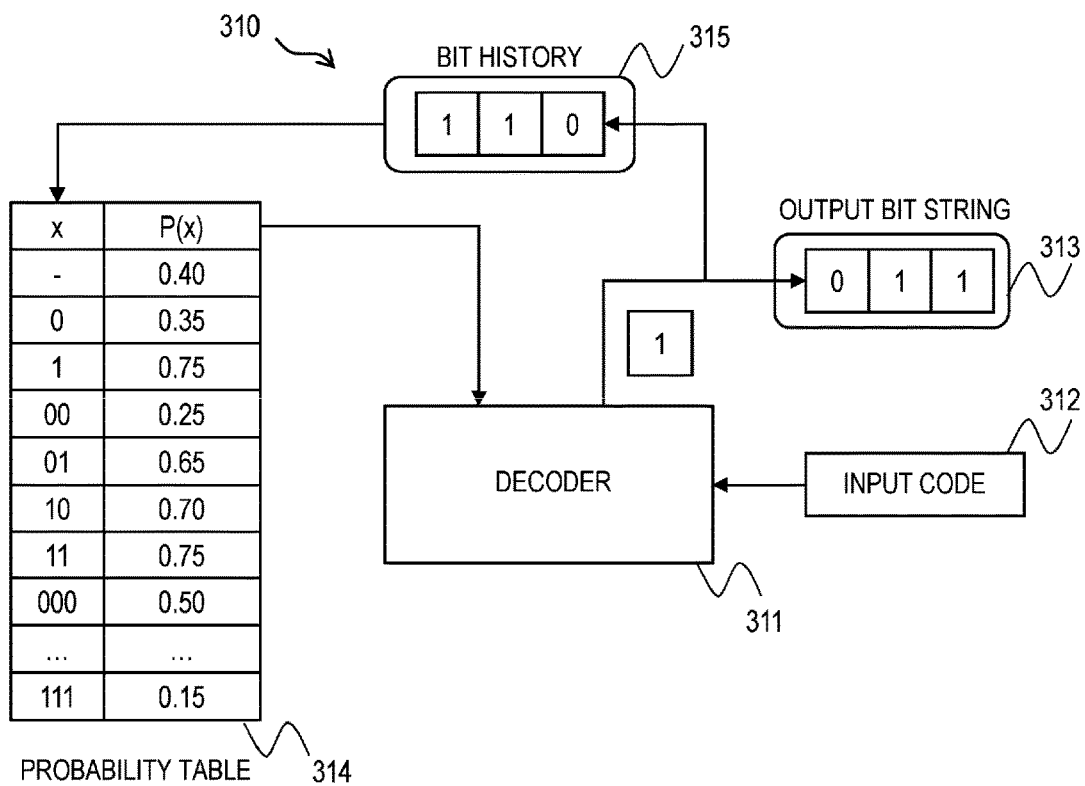
FIG. 3B shows a functional block diagram of range decoding.

FIG. 3A shows a functional block diagram of range coding, and FIG. 3B shows a functional block diagram of range decoding. A range coding function 300 will be described with reference to FIG. 3A. An encoder 301 is a calculation block that receives an input from an input bit string 302 in units of one bit and generates an output code 303. In an example in FIG. 3A, the input bit string is "1, 1, 0, 1". A method of generating the output code 303 will be described below with reference to FIGS. 4A and 4B. The output code 303 corresponds to compressed data of the LZMA algorithm (LZMA compressed data 204 in FIG. 2A).

The encoder 301 also uses a probability value cited from a probability table 304 as an input. The probability value P (x) indicates probability that a next input bit from the input bit string 302 is "0" when a bit history 305 input so far is x.

The encoder 301 performs adaptation by learning each time the probability value P (x) is used. For example, when the next input bit is actually "0", P(x) is increased, and when the next input bit is "1", P(x) is decreased. Values of all P(x) in an unused state at a start of encoding are 0.5 (the probabilities of "0" and "1" are equal).

Next, a range decoding function 310 will be described with reference to FIG. 3B. A decoder 311 is a calculation block that receives an input code 312 and generates an output bit string 313 in units of one bit. The generation method will be described below with reference to FIGS. 4A and 4B. The output bit string 313 corresponds to an input bit stream to the plaintext developing processing (plaintext developing processing 206 in FIG. 2) of the LZMA algorithm, that is, an output bit stream from the dictionary compression processing 202 in FIG. 2.

The decoder 311 also uses a probability value cited from a probability table 314 as an input. The probability value P(x) indicates probability that a next output bit is "0" when a bit history 315 output so far is x.

Similarly to the encoder 301, the decoder 311 performs adaptation by learning each time the probability value P(x) is used. For example, when the next output bit is actually "0", P(x) is increased, and when the next input bit is "1", P(x) is decreased. Values of all P(x) in an unused state at a start of decoding are 0.5 (the probabilities of "0" and "1" are equal).

When the output code 303 of the range coding function 300 and the input code 312 of the range decoding function 310 are the same, changes due to learning of all the probability values P(x) of the probability table 304 and the probability table 314 are the same. Therefore, a change at the time of coding is reproduced at the time of decoding.

(2-4) Principle of Range Coding and Decoding

Figure 4A:
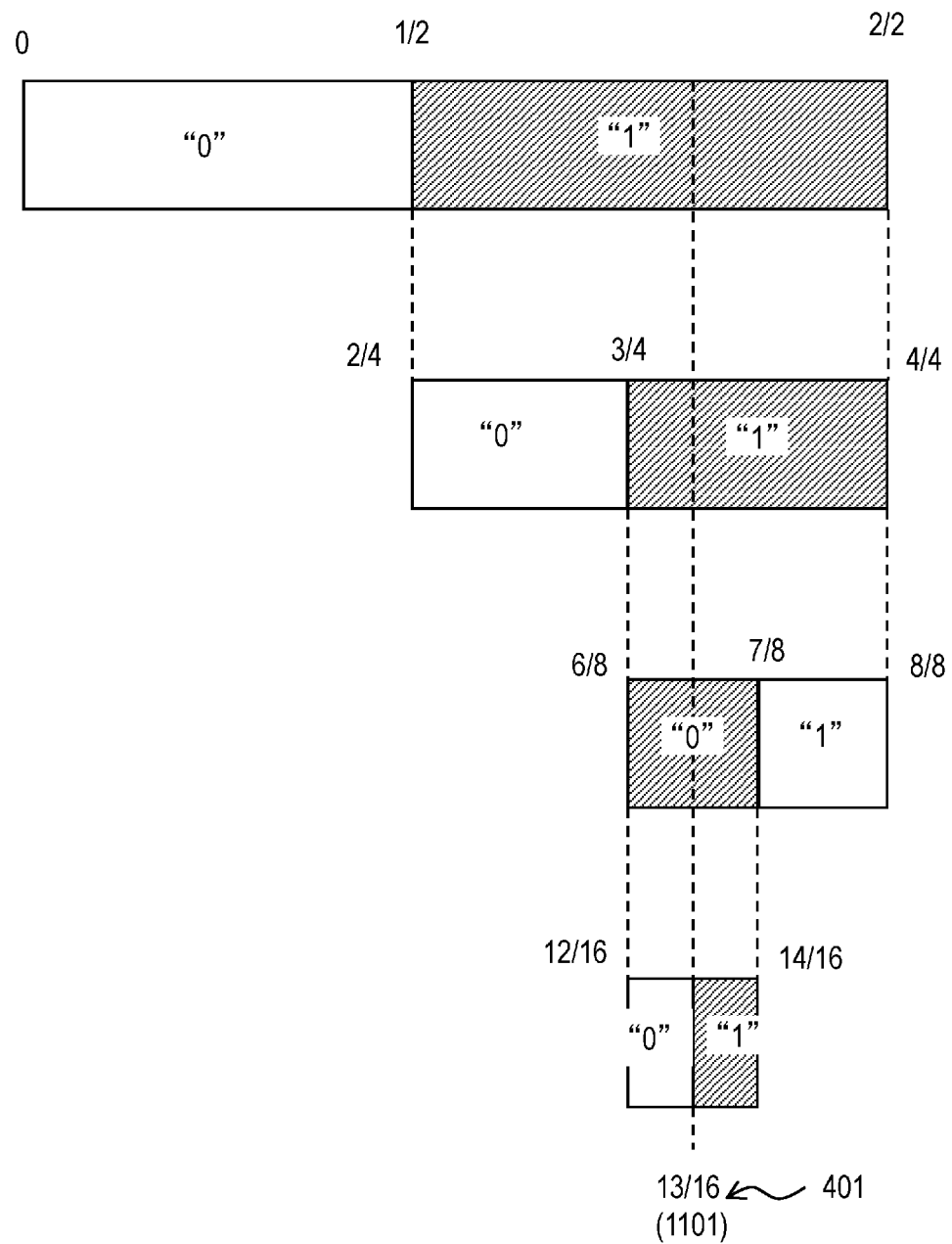
FIG. 4A shows an example for explaining a principle of a range code.
Figure 4B:
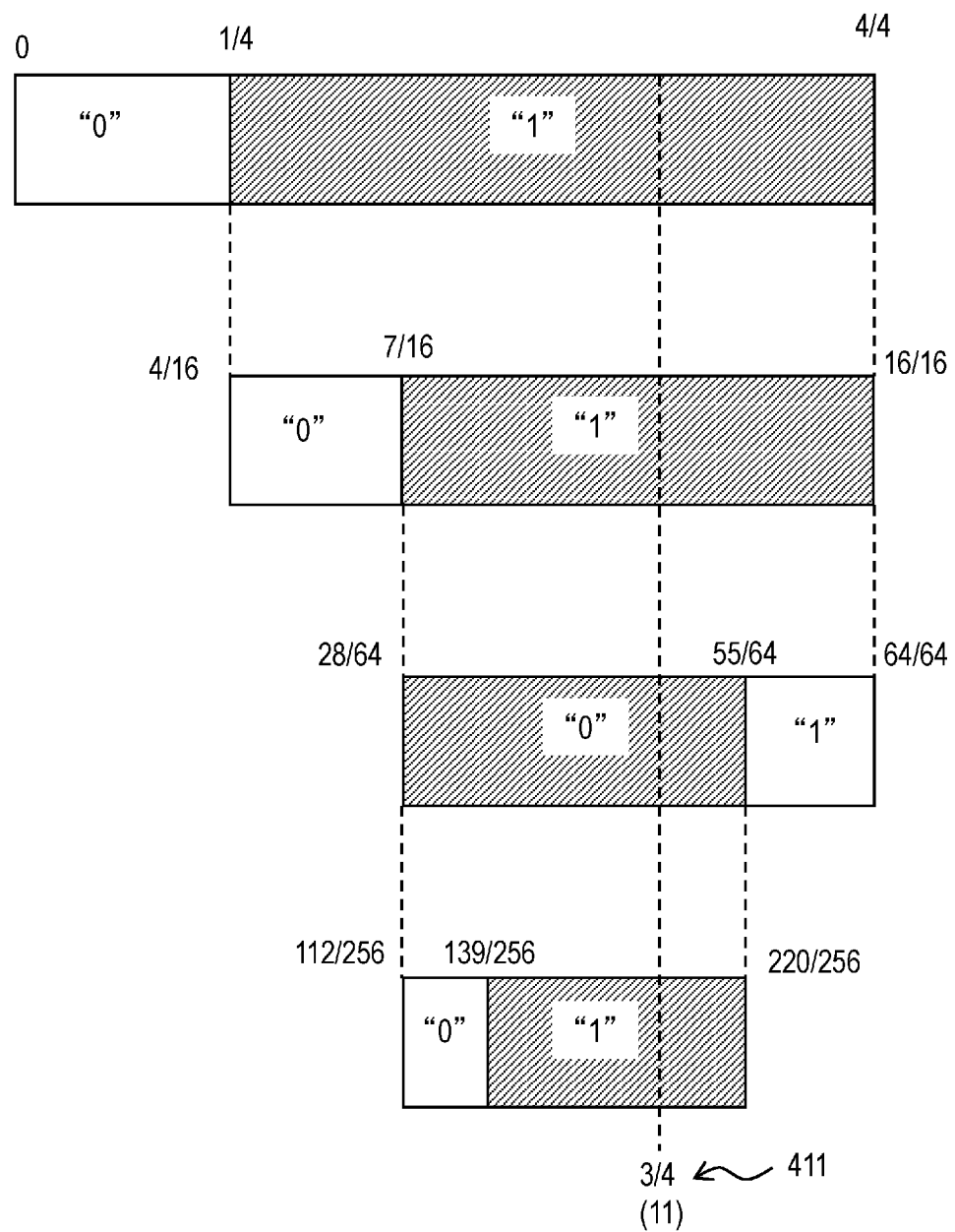
FIG. 4B shows another example for explaining the principle of the range code.

FIGS. 4A and 4B show examples for explaining a principle of range coding and decoding. In the coding processing performed by the encoder 301 in FIG. 3A, a numerical axis of [0, 1) is divided by a length corresponding to the probability that each bit value of the input bit string is "0", and one of sections is repeatedly left as a division target for a next bit. In the coding processing, coordinate values included in a finally left section are output as a code. When the bit is "0", a left section is left after division, and when the bit is "1", a right section is left after division. The probability that each bit value is "0" is acquired from the probability table 304 using the input bit history up to that time as an index.

According to a definition of the LZMA algorithm, the bit history for referring to the probability value is cleared under predetermined conditions. For example, in a case of 9 bits representing literal characters, the encoder 301 codes a first bit out of 8 bits excluding a header 1 bit by using a bit history of NULL. The encoder 301 codes a last eighth bit using first to seventh bits as a bit history, and then clears the bit history.

In the decoding processing performed by the decoder 311 in FIG. 3B, as shown in FIGS. 4A and 4B, the numerical axis of [0, 1) is divided by a length corresponding to the probability that each bit value of the output bit string is "0". Further, the decoder 311 checks which section the input code (coordinate value) is included in, determines each bit of the output bit string, and repeatedly leaves the section in which the input code is included as a division target for the next bit. Then, all the values of the output bit string are finally determined.

When a code is included in the left section in the division, the decoder 311 determines that the bit is "0", and when a code is included in the right section, the decoder 311 determines that the bit is "1". The probability that each bit value is "0" is acquired from the probability table 314 using the output bit history up to that time as an index.

The decoder 311 clears the bit history for referring to the probability value under the same conditions as the coding. For example, in the case of 9 bits representing literal characters, the decoder 311 decodes the first bit out of the 8 bits excluding the header 1 bit by using the bit history of NULL. The decoder 311 decodes the last eighth bit using the first to seventh bits as the bit history, and then clears the bit history.

FIGS. 4A and 4B each show a transition example of numerical axis division in coding and decoding processing of a bit string "1, 1, 0, 1". It is noted that the value of the probability that the bit value is "0" is different. In an example in FIG. 4A, the probability value that the bit value is "0" is normally 0.5. In an example in FIG. 4B, the probability values that the bit value is "0" are 0.25, 0.25, 0.75, and 0.25, respectively, in bit order. FIG. 4A shows a case where the probability values referred to from the probability tables 304 and 314 are in an initial state. FIG. 4B shows a case where the probability values referred to from the probability tables 304 and 314 are changed by learning.

When the bit string "1, 1, 0, 1" is frequently processed in the range coding and decoding, it is learned in the probability tables 304 and 314 that "1" is likely to appear first, "1" is likely to appear next when the history is "1", "0" is likely to appear next when the history is "11", and "1" is likely to appear next when the history is "110". When learning of such a probability proceeds and prediction of how a bit appears is correct, the output code of range coding becomes shorter.

A flow of coding in FIG. 4A is as follows.
First step: A right 1/2 section [1/2 to 2/2] is left according to the input "1".
Second step: Aright 1/2 section [3/4 to 4/4] is left according to the input "1".
Third step: A left 1/2 section [6/8 to 7/8] is left according to the input "0".
Fourth step: A right 1/2 section [13/16 to 14/16] is left according to the input "1".
13/16 (1101 in binary) included in a last section is set as the output code 401.

A flow of coding in FIG. 4B is as follows.
First step: A right 3/4 section [1/4 to 4/4] is left according to the input "1".
Second step: A right 3/4 section [7/16 to 16/16] is left according to the input "1".
Third step: A left 3/4 section [28/64 to 55/64] is left according to the input "0".
Fourth step: Aright 3/4 section [139/256 to 220/256] is left according to the input "1".
3/4 (11 in binary) included in a last section is set as the output code 411.

As the bit string is input according to the prediction based on the probability, a size of the section left in the division becomes larger. Therefore, the number of bits required to express the coordinate values of the output code included in the finally left section is small. In the example in FIG. 4A, 4 bits are required, whereas in the example in FIG. 4B, only 2 bits are required. As described above, the range code improves the compression ratio by learning the bit occurrence probability according to the bit history.

(2-5) Flowchart of Range Coding and Decoding

Figure 5A:
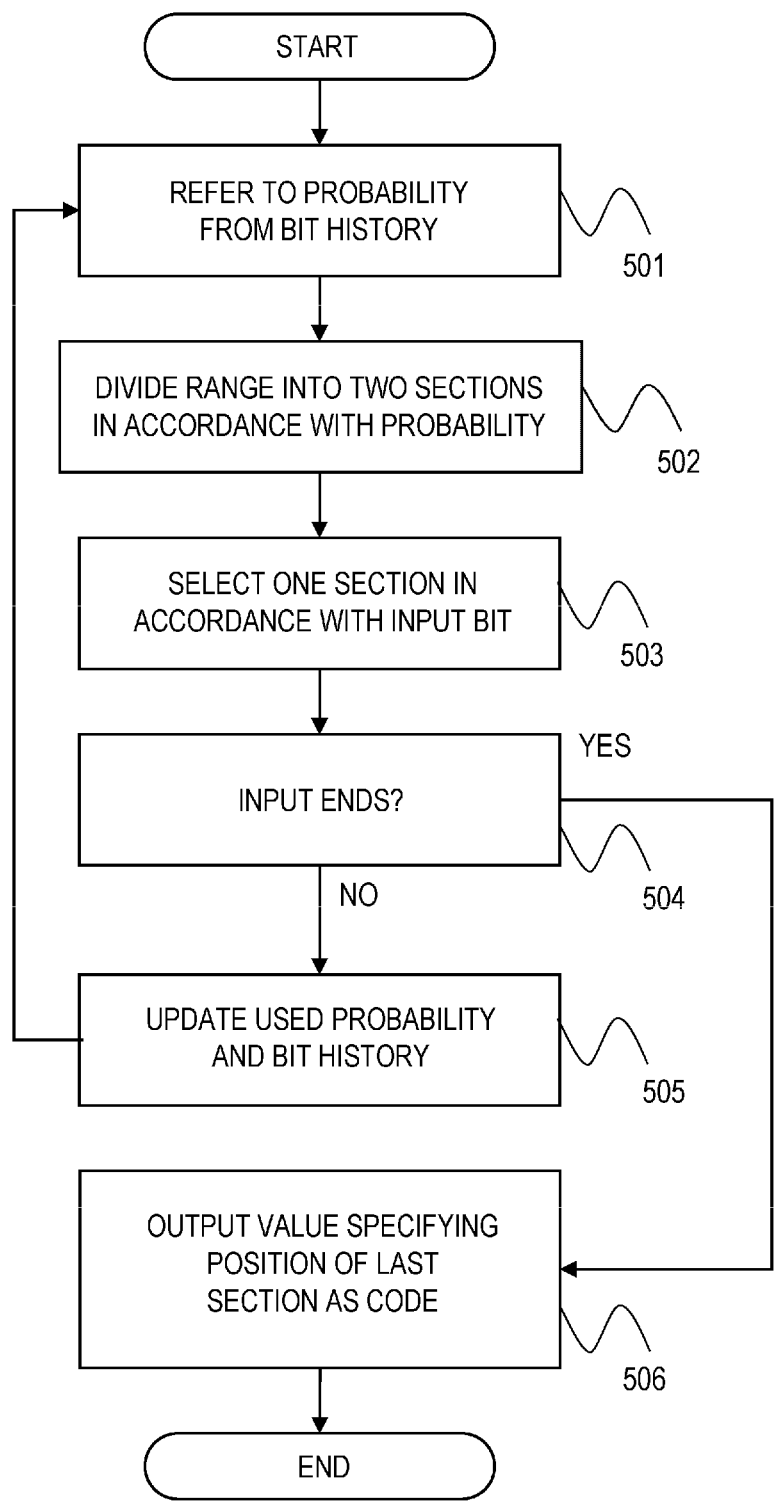
FIG. 5A shows a flowchart of range coding processing.
Figure 5B:
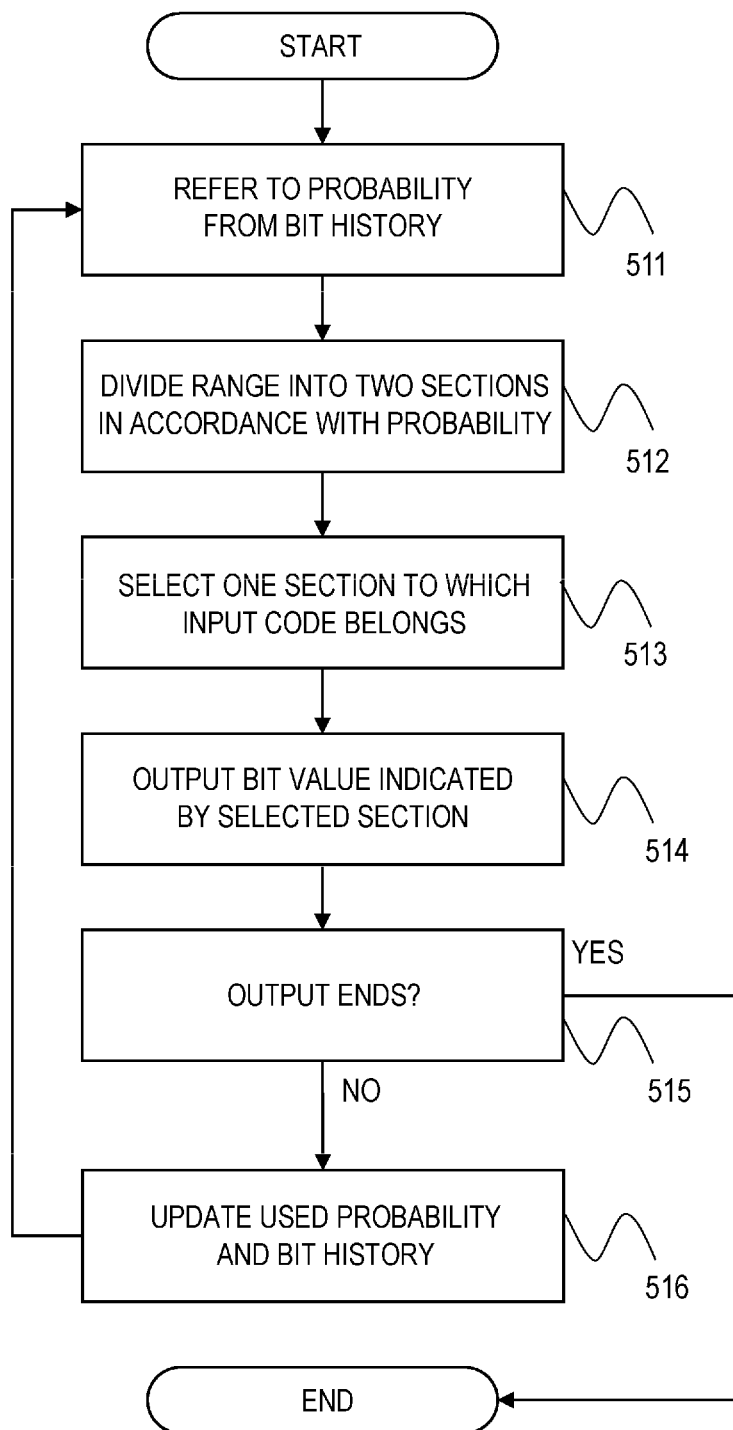
FIG. 5B shows a flowchart of range decoding processing.

FIG. 5A shows a flowchart of an example of the range coding. FIG. 5B shows a flowchart of an example of the range decoding. First, a procedure of the range coding will be described with reference to FIG. 5A.

The encoder 301 refers to the probability value that the next bit is "0" from the probability table 304 in accordance with the input bit history (501). The encoder 301 divides a numerical axis range (division target range) into two sections in accordance with the probability value (502). Multiplication of a range size and the probability value is performed when dividing. This is a part that takes the longest time in the coding processing. Then, the encoder 301 selects one of the two sections in accordance with whether the input bit value is "0" or "1" (503).

Next, in step 504, the encoder 301 determines whether the input of the bit ends. When the input of the bit ends (504: YES), the process proceeds to step 506. When there is still an input (504: NO), the process proceeds to step 505.

In step 505, the encoder 301 updates the probability value used for the probability table 304, and updates the bit history for coding a next bit. The update of the probability value is to increase the probability value when the input bit value is "0", and decrease the probability value when the input bit value is "1". In the update of the bit history, the bit history is changed to "110" when the input bit next to "11" is "0", for example. Thereafter, the encoder 301 returns to step 501 and continues the coding processing.

On the other hand, in step 506, the encoder 301 outputs, as a code, a coordinate value specifying the section left at last, for example, a value having the smallest number of expression bits among values included in the section, and ends the coding processing.

A procedure of an example of the range decoding will be described with reference to FIG. 5B. The decoder 311 refers to the probability table 314 in accordance with the output bit history, and acquires the probability value that the next bit is "0" (511). The decoder 311 divides the numerical axis range into two sections in accordance with the probability value (512). The multiplication of a range size and the probability value is performed when dividing. This is a part that takes the longest time in the decoding processing. Then, the decoder 311 selects a section in which the value of the input code is included among the two sections (513). The decoder 311 outputs the bit value "0" or "1" indicated by the selected section (514).

Next, in step 515, the decoder 311 determines whether the output of the bit ends. When the output of the bit ends (515: YES), the decoder 311 ends the decoding processing. When there is still an output (515: NO), the decoder 311 proceeds to step 516.

In step 516, the decoder 311 updates the probability value used for the probability table 314, and updates the bit history for decoding a next bit. The update of the probability value is to increase the probability value when the output bit value is "0", and decrease the probability value when the output bit value is "1". In the update of the bit history, the bit history is changed to "110" when the output bit next to "11" is "0", for example. Thereafter, the decoder 311 returns to step 511 and continues the decoding processing.

(3) Speed-Up Method of Range Coding Processing

Figure 6:
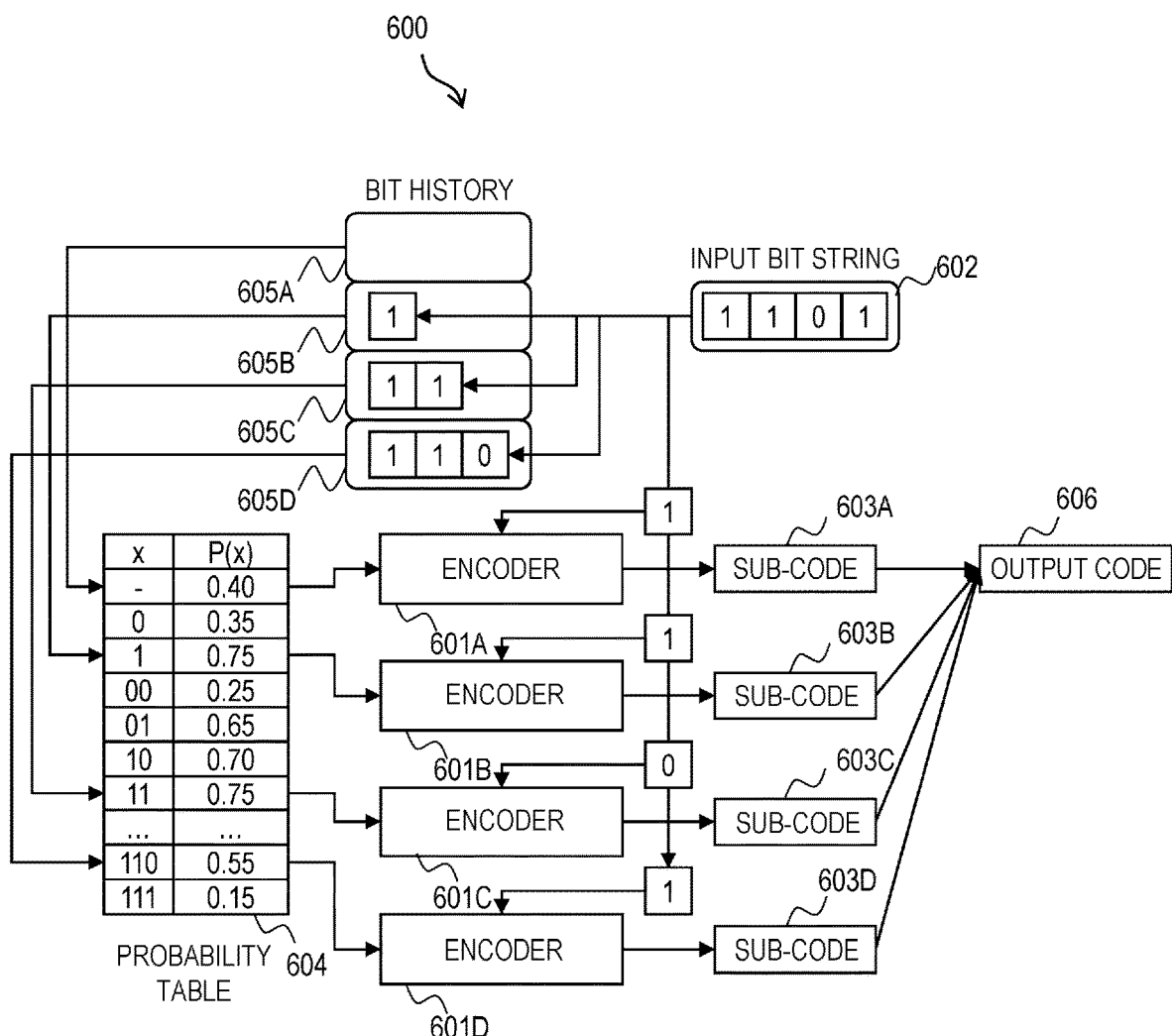
FIG. 6 shows a functional block diagram of a speed-up method of the range coding processing.

FIG. 6 shows a functional block diagram of an example of a speed-up method of range coding processing. The LZMA compression and decompression circuit 104 in FIG. 1 performs compression processing shown in this block diagram. In the example described with reference to FIGS. 3A to 5B, multiplication processing is performed with reference to the probability every time 1 bit is input. Therefore, only 1 bit can be processed in one calculation cycle, which may cause the processing performance of the LZMA algorithm to be slow.

A range coding function 600 shown in FIG. 6 speeds up the range coding processing by operating a plurality of encoders at the same time. That is, N ranges to be divided are prepared (N>1), and N types of bit histories are prepared in advance from the input bit string. The range coding function 600 simultaneously refers to N probability values in the probability table, and performs the multiplication processing on N input bits in parallel to improve the coding performance by N times.

FIG. 6 shows an example of coding in a case of N=4 according to the speed-up technique. All of four encoders 601A to 601D perform the same processing as the encoder 301 in FIG. 3A. Each encoder acquires and uses the probability value one by one from the probability table 604. These four probability values are referred to using bit histories 605A to 605D as indexes.

The bit history 605A is used when a first bit "1" of the input bit string 602 is processed by the encoder 601A, and a value thereof is NULL. The bit history 605B is used when a second bit "1" of the input bit string 602 is processed by the encoder 601B, and a value thereof is "1".

The bit history 605C is used when a third bit "0" of the input bit string 602 is processed by the encoder 601C, and a value thereof is "11". The bit history 605D is used when a fourth bit "1" of the input bit string 602 is processed by the encoder 601D, and a value thereof is "110".

In general, the bit history used for encoding the N-th bit is formed by linking the first to (N−1)-th bits. By preparing four types of bit histories in this way, the four encoders 601A to 601D can simultaneously refer to the four probability values from the probability table 604 and simultaneously perform multiplication using these probability values.

Four sub-codes 603A to 603D output from the encoders 601A to 601D are finally linked to form an output code 606. The output code 606 corresponds to compressed data of the LZMA algorithm. According to this method, since the input of 4 bits can be processed in one calculation cycle, the performance of range coding in the compression processing of the LZMA algorithm is improved 4 times as high as that of the related art.

Figure 7:
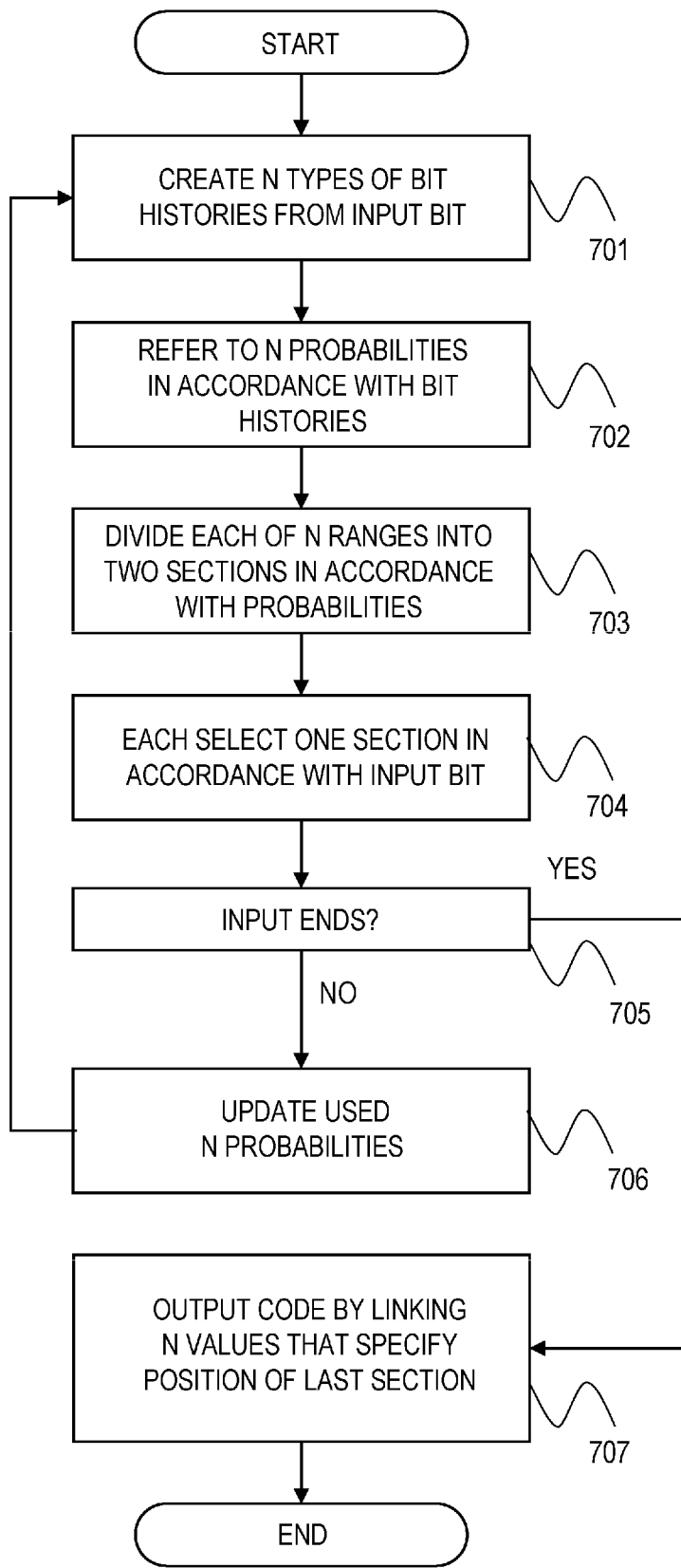
FIG. 7 shows a flowchart of the speed-up method of the range coding processing.

FIG. 7 shows an example of a flowchart of the speed-up method of range coding described with reference to FIG. 6. A procedure of the speed-up method of range coding will be described with reference to the flowchart in FIG. 7. First, the LZMA compression and decompression circuit 104 creates N types of bit histories used for coding N bits of the input bit string (701). N is an integer of 2 or more. N encoders acquire the probability values that the next bit is "0" from the probability table based on the respective bit histories (702). The N encoders divide each of N numerical axis ranges (division target ranges) into two sections in accordance with the probability values (703).

The multiplication of the range size and the probability value by the N encoders is executed in parallel. In a first cycle, the numerical axis range (range size) is common to the N encoders, and is [0, 1) in the example shown in FIG. 6. In second and subsequent cycles, the section selected by the encoder in the previous cycle becomes a target numerical axis range (range size). Each encoder selects one of the two left and right sections in accordance with whether the input bit value is "0" or "1" (704).

Next, in step 705, the LZMA compression and decompression circuit 104 determines whether the input of the bit ends. When the input of the bit ends (705: YES), the process proceeds to step 707. When there is still an input (705: NO), the process proceeds to step 706. In step 706, the LZMA compression and decompression circuit 104 updates the N probability values used for the probability table. The update of the probability value is to increase the probability value when the input bit value is "0", and decrease the probability value when the input bit value is "1".

Thereafter, the LZMA compression and decompression circuit 104 returns to step 701 and continues the coding processing. For example, when N is 4 and the coding of 8 bits of the literal character is performed, first-half 4 bits are coded in the first cycle in this flow, and second-half 4 bits are coded in the second cycle. In the second cycle, the bit history used for coding a fifth bit is a bit string of the first-half 4 bits.

For example, when the input bit string is 6 bits, for example, first-half 4 bits or 3 bits may be coded in the first cycle, and second-half 2 bits or 3 bits may be coded in the second cycle. The maximum value of the input bit string to the LZMA compression and decompression circuit 104 is 4, and a bit string equal to or less than 4 bits can be coded.

In step 707, each encoder generates a coordinate value specifying a section left at last, for example, a value having the smallest number of expression bits among values included in the section. The LZMA compression and decompression circuit 104 outputs the bit string obtained by linking the N bits as a code, and ends the encoding processing.

In the example of the range coding shown in FIG. 6, the integer N>1, and the number of input bits is N bits, that is, the length of the bit history is the maximum (N−1) bits. In the range coding, a coding speed can be increased to N times by using N ranges to be divided. As mentioned in the example of 8 bits of the literal character in the description with reference to FIG. 7, when an integer M>N and the number of input bits is M bits, that is, the length of the bit history is the maximum (M−1) bits, the coding of the input bits can be speeded up by using N ranges to be divided.

Hereinafter, the method will be described by taking a case of M=8 and N=4 as an example. The LZMA compression and decompression circuit 104 includes a probability table of 255 entries having a bit history of up to 7 bits as an index. The LZMA compression and decompression circuit 104 prepares four types of bit histories (NULL, 1 bit, 2 bits, and 3 bits, separately) to be used for coding the first-half 4 bits of the input bit string of 8 bits, and refers to four probability values corresponding thereto in the probability table at the same time. The LZMA compression and decompression circuit 104 codes the first-half 4 bits in parallel in the first cycle using these probability values.

Next, the LZMA compression and decompression circuit 104 prepares four types of bit histories (4 bits, 5 bits, 6 bits, and 7 bits each including the first-half 4 bits at the head) used for coding the second-half 4 bits of the input bits, and simultaneously refers to the four corresponding probability values from the probability table. The LZMA compression and decompression circuit 104 codes the second-half 4 bits in parallel in the second cycle using these probability values.

In this way, the LZMA compression and decompression circuit 104 processes the input of 8 bits in two cycles (that is, 4 times the performance), generates four sub-codes, and links the sub-codes to configure an output code.

In general, in the coding processing of the range code to which M bits are input, M bits are processed in [M/N] calculation cycles by using N encoders and the probability table of the (2^M−1) entries having the bit history of the maximum (M−1) bits as an index, thereby improving the performance thereof. The LZMA compression and decompression circuit 104 may generate a sub-code without performing the parallel processing.

(4) Speed-Up Method of Range Decoding Processing

Speed-up of the range decoding processing by N times cannot be implemented only by operating N decoders 311 in FIG. 3B in parallel. This is because the bit history used in the processing of a certain decoder X is uncertain until a decoder Y that decodes the previous bit outputs a processing result. Therefore, the reference of the probability value from the probability table and the multiplication using the value by the decoder X cannot performed at the same time as the reference of the probability value from the probability table and the multiplication using the value by the decoder Y, and parallelization cannot be implemented.

Figure 8:
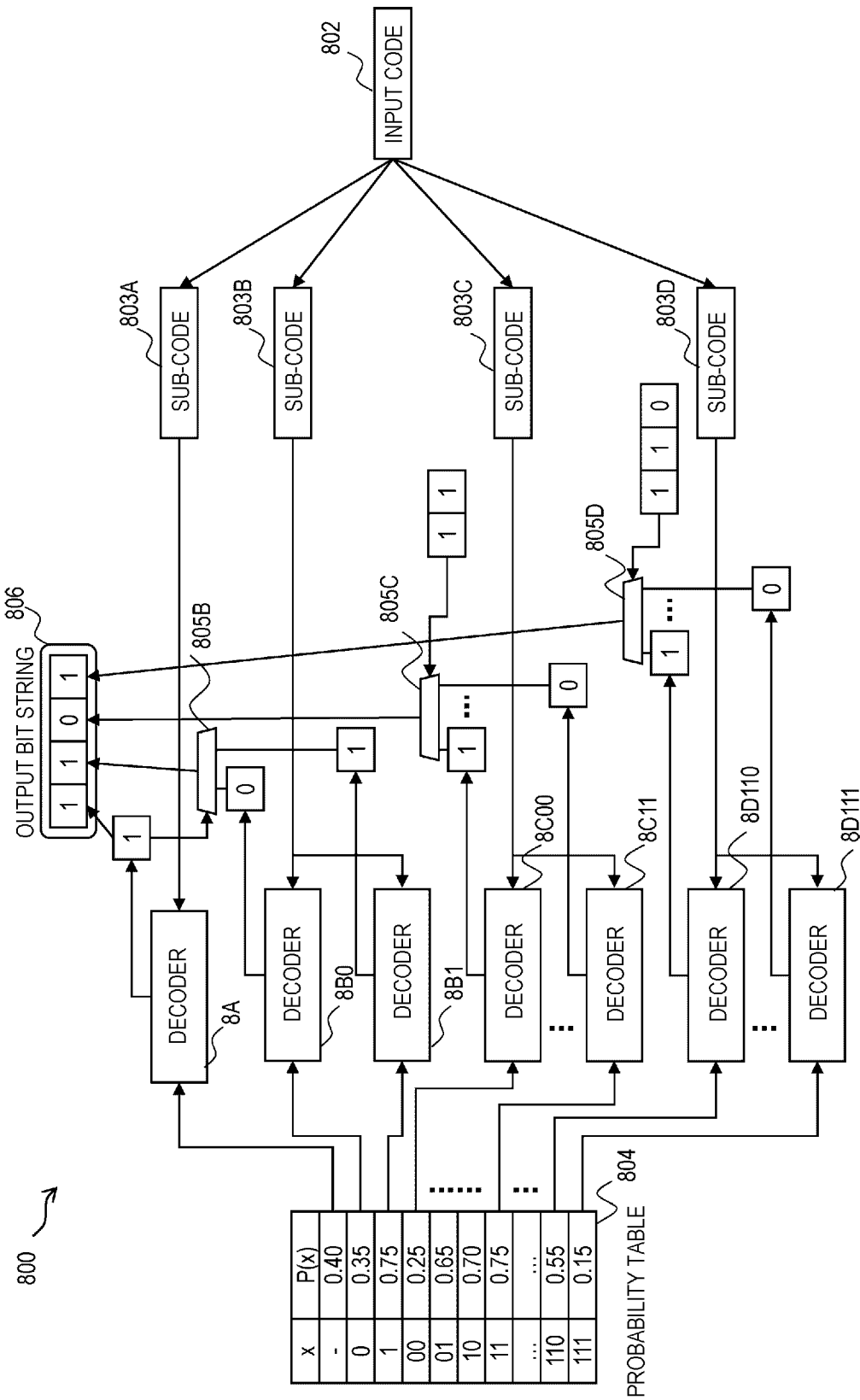
FIG. 8 shows a functional block diagram of a speed-up method of the range decoding processing.

Hereinafter, a method of speeding up range decoding processing according to the embodiment of the present specification will be described. FIG. 8 shows a functional block diagram of a speed-up method of range decoding processing. The LZMA compression and decompression circuit 104 in FIG. 1 performs decompression processing by a range decoding function 800 shown in this block diagram.

FIG. 8 shows an example of range decoding when N=4, that is, the number of bits of the output bit string is 4. All of fifteen decoders 8A (one), 8B0 and 8B1 (two), 8C00 to 8C11 (four), and 8D000 to 8D111 (eight) perform the same processing as the decoder 311 in FIG. 3B. In FIG. 8, some of the decoders are not shown. Four sub-codes 803A to 803D input to these fifteen decoders are separated from an input code 802 (corresponding to the compressed data of the LZMA algorithm), and are the same as the four sub-codes 603A to 603D in FIG. 6. One sub-code may be shared by a plurality of decoders.

Each decoder acquires the probability value one by one from the probability table 804 and uses the probability value to output a candidate bit value. These fifteen probability values are values referred to using all possible bit histories as indexes.

A value of the bit history used by the one decoder 8A for decoding the first bit of an output bit string 806 is NULL. Values of the bit histories used by the two decoders 8B0 and 8B1 for decoding the second bit of the output bit string 806 are "0" and "1", respectively.

Values of the bit histories used by the four decoders 8C00 to 8C11 for decoding the third bit of the output bit string 806 are "00", "01", "10", and "11", respectively. Values of the bit histories used by the eight decoders 8D000 to 8D111 for decoding the fourth bit of the output bit string 806 are "000", "001", "010", "011", "100", "101", "110", and "111", respectively.

In general, the number of bit histories used for decoding the K-th bit is $2^{(K-1)}$. Each bit history is a bit pattern (bit string) of (K−1) bits that may be the first to (K−1)-th bits of the output bit string 806. By preparing fifteen types of bit histories in this way, these fifteen probability values are simultaneously referred to from the probability table 804, and the fifteen decoders simultaneously perform multiplication using these probability values.

When the first bit of the output bit string 806 output by the decoder 8A is "1", it can be seen that the second bit output by the decoder 8B1 which has decoded assuming that the first bit is "1" among the decoders 8B0 and 8B1 is a correct result. A selector 805B selects "1" output by the decoder 8B1 from two second bit candidates output by the decoders 8B0 and 8B1. That is, the first and second bits are determined to be "11".

From this, it can be seen that the third bit output by the decoder 8C11 which has decoded assuming that the first and second bits are "11" among the decoders 8C00 to 8C11 is a correct result. A selector 805C selects "0" output by the decoder 8C11 from four third bit candidates output by the decoders 8C00 to 8C11. That is, the first to third bits are determined to be "110".

From this, it can be seen that the fourth bit output by the decoder 8D110 which has decoded assuming that the first to third bits are "110" among the decoders 8D000 to 8D111 is a correct result. A selector 805D selects "1" output by the decoder 8D110 from eight fourth bit candidates output by the decoders 8D000 to 8D111.

Thus, it is determined that the 4 bits of the output bit string 806 are "1101". In general, the LZMA compression and decompression circuit 104 includes $2^{(K-1)}$ decoders for decoding the K-th bit, and holds $2^{(K-1)}$ K-th bit candidates output from these decoders. The LZMA compression and decompression circuit 104 selects, as the K-th bit, a candidate output by one decoder which has decoded assuming that the value of the first to (K−1)-th bits that have already been determined is the bit history.

Bit selection processing by the selectors 805B to 805D is performed in a sufficiently shorter time than the multiplication processing by the decoder. According to this method, an output of 4 bits can be processed in one calculation cycle.

Therefore, the performance of the range decoding processing in the decompression processing of the LZMA algorithm is improved 4 times as high as that in the related art.

Figure 9:
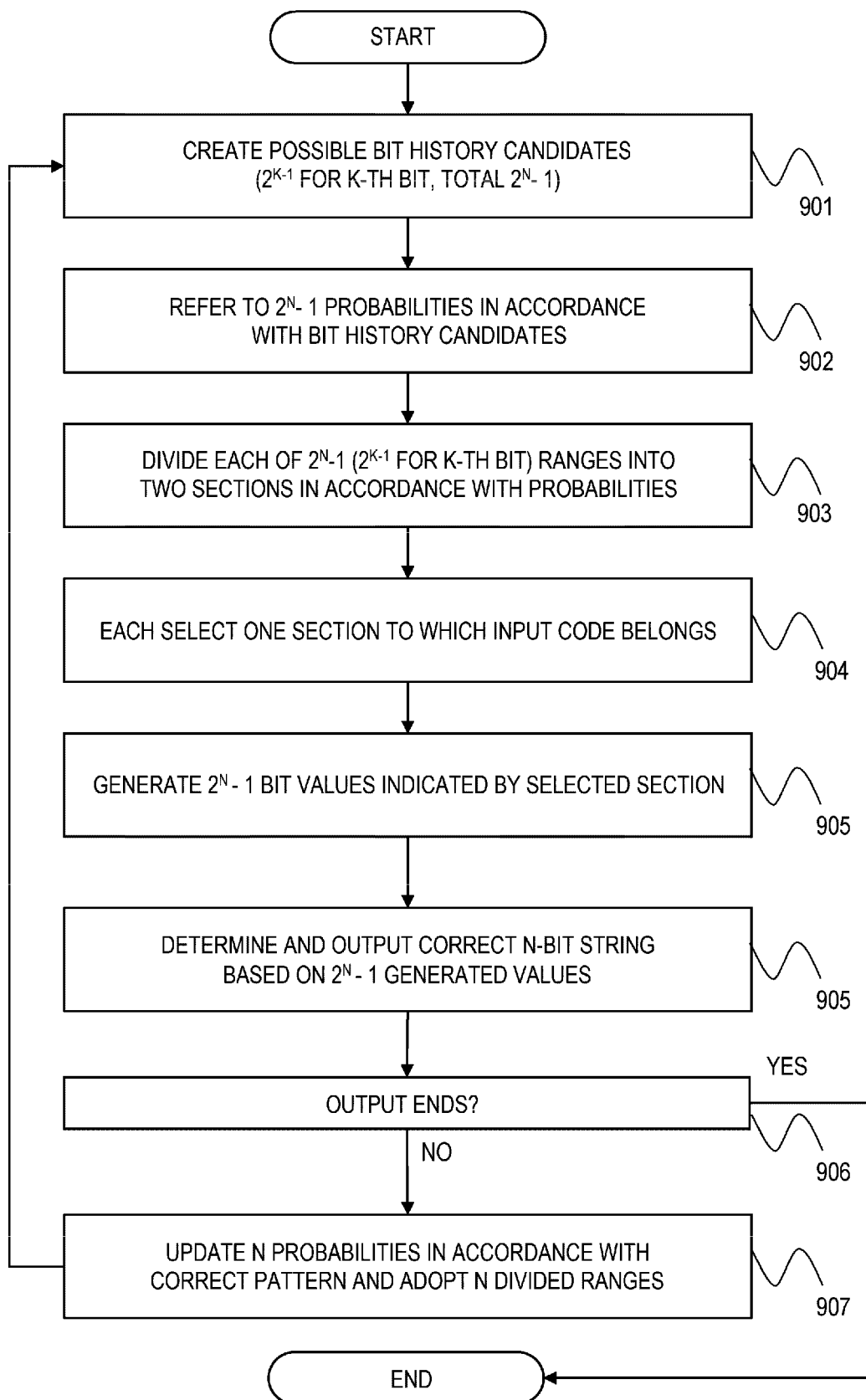
FIG. 9 shows a flowchart of the speed-up method of the range decoding processing.

A procedure of the speed-up method of range decoding described with reference to FIG. 8 will be described below with reference to FIG. 9. First, the LZMA compression and decompression circuit 104 creates (2^N−1) bit histories that may be used to decode N bits in the output bit string (901). The number of bit histories used for decoding the K-th bit is 2^(K−1).

(2^N−1) decoders acquire the probability value that the next bit is "0" from the probability table 804 in accordance with the bit history assigned to each decoder (902), and divide the numerical axis range (division target range) into two sections in accordance with the probability value (903). The numerical axis range divided by the 2^(K−1) decoders used for decoding the K-th bit is common. Specifically, the numerical axis ranges of all the decoders are common in the first cycle, and are [0, 1) in the example in FIG. 8. In second and subsequent cycles, the numerical axis range of the decoder of the K-th bit is a range of a division result obtained by the decoder that outputs a correct value of the K-th bit in the previous cycle. The multiplication of the range size and the probability value is performed when dividing.

The decoder selects a section in which the value of the input sub-code is included among the two sections (904), and generates a bit value "0" or "1" indicated by the selected section (905). The number of generated bit values is (2^N−1), and the number of K-th bit candidates is 2^(K−1). Then, the selector selects one correct bit from the candidates in order from the first bit, and determines and outputs a pattern of N bits (906). In the selection of the correct value of the K-th bit, the correct values of the first to (K−1)-th bits are used as a bit history.

Next, in step 906, the LZMA compression and decompression circuit 104 determines whether the output of the bit ends. When the output of the bit ends (906: YES), the LZMA compression and decompression circuit 104 ends the decoding processing. When there is still an output (906: NO), the LZMA compression and decompression circuit 104 proceeds to step 907.

In step 907, the LZMA compression and decompression circuit 104 updates the N probability values used for the probability table 804. The update of the probability value is to increase the probability value when the output bit value is "0" and decrease the probability value when the output bit value is "1". Further, the LZMA compression and decompression circuit 104 adopts the section selected in step 904 by the decoder that has output the correct bit value as the numerical axis range of a next cycle. The section selected in step 904 by one decoder that has output the correct value of the K-th bit among the 2^(K−1) decoders for the K-th bit is adopted as the numerical axis range divided in step 903 in next decoding of the K-th bit.

Thereafter, the LZMA compression and decompression circuit 104 returns to step 901 and continues the decoding processing. For example, as for the 8 bits of the literal character, when the first-half 4 bits and the second-half 4 bits are coded in two cycles, the bit history used for decoding the fifth bit in the second cycle in the present flow is a bit string of the first-half 4 bits.

For example, when input data of 6 bits is coded in two cycles by being divided into the first-half 4 bits and remaining 2 bits, the LZMA compression and decompression circuit 104 may decode 4 bits or 3 bits in the first cycle and then decode 2 bits or 3 bits in the second cycle. The maximum value of the input bit string to the LZMA compression and decompression circuit 104 is 4, and a bit string equal to or less than 4 bits can be decoded.

In the speed-up method of range code decoding processing shown in FIG. 8, when the integer N>1, the number of input bits is N bits (that is, the length of the bit history is the maximum (N−1) bits), and the speed is increased to N times by using N ranges to be divided. As mentioned in the example of 8 bits of the literal character with reference to FIG. 9, when the integer M>N and the number of input bits is M bits, that is, the length of the bit history is maximum (M−1) bits, the decoding of the output bit string can be speeded up by using the N ranges to be divided.

Hereinafter, an example of decoding an output bit string of 8 bits will be described. The LZMA compression and decompression circuit 104 includes fifteen decoders as in FIG. 8, and inputs four sub-codes separated from input codes (corresponding to compressed data of the LZMA algorithm) to these fifteen decoders as in FIG. 8. Each decoder acquires and uses the probability value one by one from a probability table of 255 entries having a bit history of up to 7 bits as an index.

The fifteen probability values referred to in the first cycle are values referred to by using all the bit histories (NULL, 1 bit, 2 bits, and 3 bits, separately) that may be the first-half 4 bits of the output bit string of 8 bits as indexes. The value of the bit history used by one decoder that decodes the first bit of the output bit string is NULL.

The values of the bit histories used by the two decoders that decode the second bit of the output bit string are "0" and "1", respectively. The values of the bit histories used by the four decoders that decode the third bit of the output bit string are "00", "01", "10", and "11", respectively. The values of the bit histories used by the eight decoders that decode the fourth bit of the output bit string are "000", "001", "010", "011", "100", "101", "110", and "111", respectively.

The fifteen decoders perform multiplication in parallel using the probability values referred to in these bit history. Then, similarly to FIG. 8, the bit selection processing of the selector determines the values of the first bit to the fourth bit in order. Here, for example, "1101" is determined.

Next, the fifteen probability values referred to in the second cycle are values referred to by using all the bit histories (4 bits, 5 bits, 6 bits, and 7 bits each including "1101" determined in the first cycle at the head) that may be the second-half 4 bits of the output bit string of 8 bits as indexes.

The value of the bit history used by one decoder that decodes the fifth bit of the output bit string is "1101". The values of the bit histories used by the two decoders that decode the sixth bit of the output bit string are "11010" and "11011", respectively. The values of the bit histories used by the four decoders that decode the seventh bit of the output bit string are "110100", "110101", "110110", and "110111", respectively.

The values of the bit histories used by the eight decoders that decode the eighth bit of the output bit string are "1101000", "1101001", "1101010", "1101011", "1101100", "1101101", "1101110", and "1101111", respectively.

The fifteen decoders perform the multiplication in parallel using the probability values referred to in these bit histories. Then, similarly to FIG. 8, the bit selection processing of the selector determines the values of the fifth bit to the eighth bit in order.

As in FIG. 8, the bit selection processing of the selector is performed in a sufficiently shorter time than the multiplication processing of the decoder. Therefore, according to this method, the output of 8 bits can be processed in two calculation cycles. As described above, in the probability table of 255 entries, 15 entries are referred to in the first cycle, and 15 entries are selected from the remaining 240 entries and referred to in the second cycle. In the second cycle, the number of entries to be referred to is narrowed down to 1/16 by indexing with the bit history including the first-half 4 bits determined in the first cycle.

In general, in the decoding processing of the range code from which M bits are output, M bits are processed in [M/N] calculation cycles by using ($2^N$−1) encoders and the probability table of the ($2^M$−1) entries having the bit history of the maximum (M−1) bits as an index, thereby improving the performance thereof.

As described above, according to the embodiment of the present specification, data compressed by the range code can be decompressed at high speed. Therefore, for example, in an apparatus storage system having a data compression function based on a range code algorithm, read response performance of compressed data can be improved.

The invention is not limited to the embodiments described above, and includes various modifications. For example, the embodiments described above are described in detail for easy understanding of the invention, and the invention is not necessarily limited to those including all the configurations described above. In addition, a part of the configuration of one embodiment can be replaced with the configuration of another embodiment, and the configuration of another embodiment can be added to the configuration of one embodiment. A part of the configuration of each embodiment can be added, deleted, or replaced with another configuration.

Each of the configurations, functions, processing units, and the like described above may be partially or entirely implemented by hardware such as through design using an integrated circuit. The above configurations, functions, and the like may also be implemented by software by means of interpreting and executing a program, by a processor, for implementing respective functions. Information of programs, tables, files or the like for implementing each function can be placed in a recording device such as memory, hard disk, and Solid State Drive (SSD), or a recording medium such as an IC card and an SD card.

In addition, control lines and information lines are those that are considered necessary for the description, and not all the control lines and the information lines on the product are necessarily shown. In practice, almost all the configurations may be considered to be mutually connected.

What is claimed is:

1. An apparatus for processing received data, the apparatus comprising:
   a circuit configured to receive an input code compressed based on a range code; and
   a decompression circuit configured to decompress a part or all of the input code to decode an N-bit string, wherein
   N represents an integer greater than 1, and K represents an integer from 1 to N,
   a bit value of a K-th bit of the input code is decoded based on a bit history of a bit before the K-th bit, and
   the decompression circuit is configured to calculate a plurality of candidate bit values for each bit of the N-bit string based on a plurality of possible bit histories of the bit before the K-th bit for a plurality of bits.

2. The apparatus according to claim 1, wherein the decompression circuit is configured to repeatedly select a correct bit value of the K-th bit from the plurality of candidate bit values based on a correct bit history of the bit before the K-th bit to decode the N-bit string.

3. The apparatus according to claim 1, wherein the decompression circuit is configured to calculate the plurality of candidate bit values for each bit of the N-bit string based on the plurality of possible bit histories of the bit before the K-th bit in parallel for three or more bits.

4. The apparatus according to claim 3, wherein, in calculating the plurality of candidate bit values in parallel for three or more bits, a number of the candidate bit values for a (K+1)-th bit is twice a number of the K-th bit.

5. The apparatus according to claim 1, wherein
   the decompression circuit is configured to
   store probability values of a bit value appearing in accordance with the bit history, and
   select and update a probability value corresponding to a bit history based on correct bits constituting the decoded N-bit string from the stored probability values.

6. The apparatus according to claim 1, wherein
   in calculation of the candidate bit values of the K-th bit in the N-bit string, multiplication of a division target range by probability values of $2^{(K-1)}$ bit histories is performed to divide the division target range into two sections, and each of $2^{(K-1)}$ Candidate bit values is determined from a section specified by a sub-code among the two sections of the K-th bit in the input code.

7. The apparatus according to claim 1, wherein
   when the number of bits to be decoded from the entire input code is larger than a preset maximum value, the decompression circuit performs decoding of a bit string based on a part of the input code for a plurality of cycles.

8. The apparatus according to claim 7, wherein
   in a second and subsequent cycles of the plurality of cycles, a division target range for determining each of the candidate bit values of the K-th bit is a section corresponding to a correct bit value of the K-th bit in an immediately preceding cycle.

9. A storage system, comprising:
   an interface configured to receive a request from a host; and
   a controller configured to execute writing of data to a storage drive and reading of data from the storage drive in accordance with a command from the host, wherein
   the controller includes the decompression circuit according to claim 1,
   the controller is configured such that, in accordance with a read command from the host, the input code transferred from the storage drive is decoded by the decompression circuit to generate read data, and
   the read data is replied to the host via the interface.

10. The storage system according to claim 9, wherein
    the decompression circuit is configured to
    store probability values of a bit value appearing in accordance with the bit history, and
    select and update a probability value of each of correct bit values constituting the decoded N-bit string from the stored probability values.

11. The storage system according to claim 9, wherein
    in calculation of the candidate bit values of the K-th bit in the N-bit string, multiplication of a division target range by probability values of $2^{(K-1)}$ bit histories is performed to divide the division target range into two sections, and a candidate bit value is determined from each of $2^{(K-1)}$ sections for a sub-code of the K-th bit in the input code.

12. The storage system according to claim 9, wherein
when the number of bits to be decoded from the entire input code is larger than a preset maximum value, the decompression circuit performs decoding of a bit string based on a part of the input code for a plurality of cycles.

13. The storage system according to claim 12, wherein
in a second and subsequent cycles of the plurality of cycles, a division target range for determining each of the candidate bit values of the K-th bit is a section corresponding to a correct bit value of the K-th bit in an immediately preceding cycle.

14. A method for processing received data in an apparatus including a decompression circuit, the method comprising:
receiving an input code compressed based on a range code; and
decompressing a part or all of the input code to decode an N-bit string by the decompression circuit, wherein
N represents an integer greater than 1, and K represents an integer from 1 to N,
wherein a bit value of a K-th bit of the input code is decoded based on a bit history of a bit before the K-th bit, and
wherein the decompressing includes
calculating a plurality of candidate bit values for each bit of the N-bit string based on a plurality of possible bit histories of the bit before the K-th bit for a plurality of bits.

* * * * *